United States Patent
Eggs et al.

(10) Patent No.: US 8,940,359 B2
(45) Date of Patent: Jan. 27, 2015

(54) METHOD OF PRODUCING A MICROACOUSTIC COMPONENT

(75) Inventors: Christoph Eggs, Rattenkirchen (DE); Gudrun Henn, Ebenhausen (DE); Werner Ruile, Munich (DE); Guenter Scheinbacher, Baldham (DE); Siegfried Menzel, Lausitz (DE); Mario Spindler, Dresden (DE)

(73) Assignee: Epcos AG, Munich (DE)

( * ) Notice: Subject to any disclaimer, the term of this patent is extended or adjusted under 35 U.S.C. 154(b) by 22 days.

(21) Appl. No.: 13/223,892

(22) Filed: Sep. 1, 2011

(65) Prior Publication Data

US 2012/0056507 A1   Mar. 8, 2012

(30) Foreign Application Priority Data

Sep. 3, 2010 (DE) .................. 10 2010 036 256

(51) Int. Cl.
| | |
|---|---|
| B05D 5/12 | (2006.01) |
| C23C 16/44 | (2006.01) |
| H03H 3/02 | (2006.01) |
| H01L 41/23 | (2013.01) |
| H01L 41/29 | (2013.01) |
| H01L 41/316 | (2013.01) |

(52) U.S. Cl.
CPC ............... *H03H 3/02* (2013.01); *H01L 41/23* (2013.01); *H01L 41/29* (2013.01); *H01L 41/316* (2013.01)

USPC ........ 427/100; 427/124; 427/126; 427/255.28

(58) Field of Classification Search
USPC ................... 427/100, 124, 126.1, 255.28
See application file for complete search history.

(56) References Cited

U.S. PATENT DOCUMENTS

| | | | |
|---|---|---|---|
| 6,124,158 A * | 9/2000 | Dautartas et al. .............. 438/216 |
| 6,743,475 B2 * | 6/2004 | Skarp et al. ............... 427/255.31 |
| 6,943,648 B2 * | 9/2005 | Maiz et al. ...................... 333/188 |
| 8,525,619 B1 * | 9/2013 | Olsson et al. .................. 333/187 |
| 2002/0003403 A1 * | 1/2002 | Ghosh et al. ................... 313/512 |
| 2003/0022412 A1 * | 1/2003 | Higgins et al. ................... 438/50 |
| 2003/0233864 A1 * | 12/2003 | Rodier ........................... 73/24.06 |
| 2004/0217829 A1 * | 11/2004 | Maiz et al. ...................... 333/188 |
| 2006/0093848 A1 * | 5/2006 | Senkevich et al. ............. 428/585 |
| 2010/0212127 A1 * | 8/2010 | Heinze et al. ................. 29/25.35 |
| 2010/0304501 A1 * | 12/2010 | Lee et al. ....................... 436/518 |
| 2011/0037538 A1 | 2/2011 | Ruile et al. |
| 2013/0176085 A1 * | 7/2013 | Barber et al. .................. 333/187 |

FOREIGN PATENT DOCUMENTS

| | | |
|---|---|---|
| DE | 10 2008 001 000 A1 | 10/2009 |
| DE | 10 2008 016 613 A1 | 10/2009 |
| WO | WO 2009/121901 A1 | 10/2009 |

* cited by examiner

*Primary Examiner* — Brian K Talbot
(74) *Attorney, Agent, or Firm* — Slater & Matsil, L.L.P.

(57) ABSTRACT

The microacoustic component has a substrate that has at least one layer (composed of a dielectric or piezoelectric material, and a metallic strip structure. The layer is composed of a dielectric or piezoelectric material and/or the metallic strip structure have/has been produced or can be produced by the atomic layer deposition method.

18 Claims, 2 Drawing Sheets

METHOD OF PRODUCING A MICROACOUSTIC COMPONENT

This application claims priority to German Patent Application 10 2010 036 256.5, which was filed Sep. 3, 2010 and is incorporated herein by reference.

TECHNICAL FIELD

The present invention relates to the production of microacoustic components.

BACKGROUND

Conventional deposition methods especially thin layer deposition methods such as vapor deposition, sputtering or PECVD (plasma-enhanced chemical vapor deposition) are used in the production of microacoustic components to produce layers and electrodes. Fluctuations in the thickness of the deposited layer occur in this case. A non-uniform material distribution can occur between different wafers, but also on the same wafer. Since characteristic variables of the components, for example the frequency, are sensitively dependent on the layer thickness, the narrow specifications required are fulfilled only by a small proportion of the components thus produced, unless further complicated process steps are carried out.

If dielectric layers are deposited by one of the methods mentioned, the deposition rate is generally so low that the process takes a very long time and can consequently become uneconomic if a large layer thickness of more than 1 μm is intended to be produced.

If dielectric layers are applied on structured metal planes, a good edge coverage of the metal layer is intended to be achieved. If thick metallizations are covered with a high metal proportion, cavities, so-called voids, can occur in the dielectric material, which significantly impair the properties of the component.

In the case of surface wave components provided with electrodes which are embodied in strip-type fashion and are intermeshed with one another in a comb-like manner, an undesirable material transport can occur, brought about by mechanical stress in the electrode material. Such a material transport takes place in the case of specific metallizations (for example composed of copper), principally at outer interfaces, for which reason it is necessary for the electrodes to be enveloped. A sufficiently good coverage of the outer interfaces of the electrodes cannot always be achieved in the desired manner, however, with the deposition methods mentioned.

In the case of bulk acoustic wave resonators, homogeneous dielectric layers are applied in order to alter the acoustic properties of a piezoelectric layer, that is, for example, altering and adapting the frequency of the resonator. Trimming processes can then be carried out at these dielectric layers in order to improve the frequency accuracy and the operating properties of the microacoustic components. Otherwise those components which do not comply with the predefined tolerance limits are separated out.

The adhesion of the layers produced by vapor deposition or sputtering in particular of hard layers, is inadequate under certain circumstances. If appropriate, it is necessary to reduce the layer thickness or, with additional outlay, to improve the surface area to which the layer is intended to be applied, for example in an $O_2$ plasma.

German patent document 10 2008 016613 B4 describes a method for producing an electrical component comprising at least one dielectric layer on a substrate composed of piezoelectric material.

SUMMARY OF THE INVENTION

In one aspect, the present invention specifies how the problem of excessively large layer thickness fluctuations can be eliminated in the case of microacoustic components.

The microacoustic component has a substrate, which has at least one layer composed of a dielectric or piezoelectric material, and a metallic electrode structure that can be a strip structure. In the microacoustic component, the layer composed of dielectric or piezoelectric material and/or the metallic electrode structure can be embodied as an ALD layer. In this case, an ALD layer is considered to be a layer which has been produced or can be produced by the atomic layer deposition method.

In an atomic-layer-deposition method nearly any arbitrary metal or dielectric can be deposited by means of a precursor comprising an organic carrier. The deposition is done layer by layer such that atomic monolayers can be produced supported by reactive linking of the precursor to the surface to be covered by the ALD deposition. An arbitrary number of atomic monolayers can be deposited one above the other and a perfect control of the layer thickness is possible.

In one exemplary embodiment of the microacoustic component, a covering layer is arranged as an uppermost layer and covers the metallic strip structure and the covering layer is embodied as an ALD layer.

In a further exemplary embodiment, a strip structure or layer embodied as an ALD layer comprises a metal of the first, fourth, fifth, sixth or eighth subgroup or of the third main group of the Periodic Table of the Elements or an electrically insulating oxide, nitride or carbide of an element of the third, fourth, fifth, sixth or eighth subgroup or of the second, third or fourth main group of the Periodic Table of the Elements. Dependent on the used precursor the ALD layer can be deposited in very pure form.

In a further exemplary embodiment, a strip structure or layer embodied as an ALD layer comprises a metal and 5 to 20 atomic percent of a further element.

In a further exemplary embodiment, a strip structure or layer embodied as an ALD layer comprises an oxide, nitride or carbide and 5 to 50 atomic percent of a further element, oxide, nitride or carbide.

In a further exemplary embodiment, a dielectric layer is arranged above a layer stack and is embodied as an ALD layer. The layer stack can have at least one doped layer having a dopant concentration having a gradient.

The microacoustic component can be, in particular, a surface acoustic wave component (SAW component), a guided bulk acoustic wave component GBAW or an FBAR component (FBAR: thin-film bulk acoustic resonator).

In a SAW component the metallic strip structure can comprise one or more different sub-layers, one of which or all being embodied as an ALD layer. Electrodes that are resistant to a higher electric power can comprise alternating sub-layers of Al and a metal that has a higher hardness than Al like Cu. The covering layer too can be embodied as an ALD layer.

A GBAW or LGBAW component can be embodied at least partly by an ALD layer deposited on a substrate.

Further, in an FBAR or BAW component the acoustic minor that is arranged between a substrate and a bottom electrode can comprise one or more layers deposited by ALD.

When a seed layer is required below a (metallic) layer to produce a desired crystallographic orientation or a homogenous growth of the (metallic) layer, the seed layer too can be an ALD layer.

Generally, an ALD layer provides more advantages when more layers have to be deposited one above the other and more accuracy of the layer thickness is required. In a staple of layers, the bottom layer embodied as an ALD layer facilitates homogenous growth of the further layers above. A top layer embodied as an ALD layer allows deposition of a layer with a homogenous thickness on uneven surfaces.

If most or all of the layers in a staple of layers within a micro-acoustic component are embodied as ALD layers the highest homogeneity in view of structure and layer thickness will result.

Using ALD layers allows the enhancement of the number of layers that are to be deposited one above the other without diminishing quality and homogeneity of the layers. Preferably, ALD layers are used in components where component structures of two or more components are stacked directly above one another. Components comprising stacked SAW or BAW resonators can be manufactured with high quality and high yield.

In the method for producing a microacoustic component, at least one layer composed of dielectric or piezoelectric material and/or a metallic strip structure are/is produced by atomic layer deposition. In particular, a covering layer composed of dielectric material can be produced by atomic layer deposition, and a metallic strip structure composed of gold or composed of a copper, silver or aluminum alloy can be enveloped by the covering layer. The above-mentioned object is generally achieved by the use of the atomic layer deposition method for producing a microacoustic component.

BRIEF DESCRIPTION OF THE DRAWINGS

Examples of the component and of the production method are described in greater detail below with reference to the accompanying figures.

The following list of reference symbols may be used in conjunction with the drawings:

1 Substrate
2 Metallic strip structure
3 Covering layer
4 Layer composed of dielectric or piezoelectric material
5 Layer of a layer stack
6 Layer of a layer stack
S substrate
AS acoustic mirror
LIL low impedance layer
HIL high impedance layer
EL1, EL2 electrode layers
PSL passivation layer
ML metal layer

DETAILED DESCRIPTION OF ILLUSTRATIVE EMBODIMENTS

Figure 1:
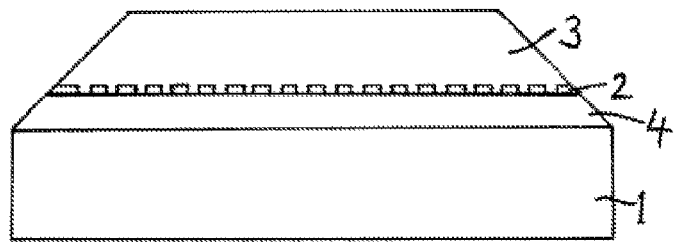
FIG. 1 shows a cross section through one exemplary embodiment of a microacoustic component.

FIG. 1 shows a schematic cross section through a microacoustic component. A substrate 1 has a layer 4 composed of dielectric or piezoelectric material. The layer 4 can also encompass the entire substrate 1, for example, if the material of the substrate 1 is $LiNbO_3$. A metallic strip structure 2 is arranged on the layer 4, which metallic strip structure can be provided, in particular, for electrodes of the component. The metallic strip structure 2 can be, for example, a plurality of metal strips which are oriented parallel to one another and which are successively alternately connected to a respective connection conductor and in this way form two electrodes intermeshed with one another in a comb-like manner. By way of example, a surface wave component or surface wave filter can be formed with electrodes of this type. In the example illustrated in FIG. 1, the metallic strip structure 2 is covered on the top side with a covering layer 3, which can be a dielectric material, for example, $SiO_2$.

Figure 2:
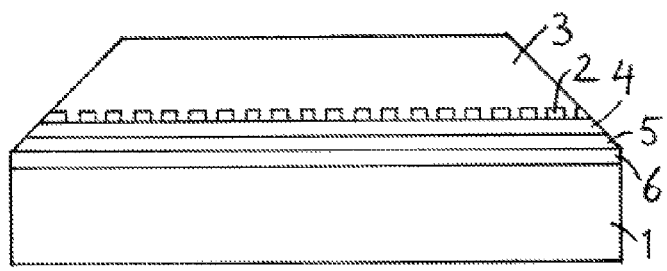
FIG. 2 shows a cross section through a further exemplary embodiment.

FIG. 2 shows another exemplary embodiment in a cross section in accordance with FIG. 1. In the case of the exemplary embodiment in FIG. 2, a layer stack composed of at least two layers 4, 5, 6 is present instead of an individual layer 4 composed of dielectric or piezoelectric material. The layers 4, 5, 6 of the layer stack can be formed from different materials or from the same material. One layer or a plurality of layers of the layer stack at a distance from the metallic strip structure 2 can be electrically conductively doped semiconductor material. The dopant concentration in the doped semiconductor material can have, in particular, a gradient.

The layer 4 composed of dielectric or piezoelectric material, the metallic strip structure 2 and/or the covering layer 3 are embodied as an ALD layer, which should be understood to mean that the layer has been produced by an atomic layer deposition method. By means of this method, atomic layers are deposited from the gas phase. In this way, it is possible to produce extremely thin layers (self-passivating monolayers) having a very uniform thickness, that is particularly advantageous for the microacoustic components. Moreover, production is readily reproducible, such that an optimum frequency accuracy and performance of the components are obtained.

ALD is a deposition from the gas phase and enables an optimum edge coverage, independently of material, thickness and degree of metallization of a layer or layer structure onto which the deposition takes place. In particular, an optimum coverage of a metallization can be achieved in this way, such that the inherent mechanical stress occurring in metallization and the resultant material transport at the surface of the metallization are reduced.

The atomic layer deposition method brings about a very good chemical bonding of the deposited material to the surface covered thereby. The adhesion of the layers thus produced is therefore very good.

In the case of deposition from the gas phase, the reactor used can be scaled almost arbitrarily in size, without altering the deposition properties. Therefore, with this method it is possible to process a large number of different wafers in one run, and this method is therefore also suitable for the production of thick dielectric layers.

In the case of FBAR components (thin-film bulk acoustic resonator), it is possible to form mirror layers, electrodes and/or piezoelectric layers as ALD layers. Mirror layers produced by the ALD method are also suitable for other acoustic components, in particular those that operate with so-called phononic bandgaps.

In another application, GBAW components (guided bulk acoustic wave) are produced. During the production of the components it must be ensured that no disturbing irregularities occur in the region of the acoustic wave. In the case of metallizations having a high aspect ratio, that is to say having distinctly pronounced steps, an irregular formation of cavities is often obtained during conventional deposition of an $SiO_2$ layer. As a result of the use of the ALD method, an $SiO_2$ layer can be deposited in a manner free of voids even in the case of a high aspect ratio, such that GBAW components, in particular, are considerably improved.

On conventional surface wave components, an ALD layer can be provided as an extremely thin, but precisely defined layer for passivation or trimming purposes. A covering layer, in particular a covering layer composed of $SiO_2$, can be produced as an ALD layer so thinly that it does not adversely influence the operating properties (performance) of the components. A metallization composed of copper, in particular, can be produced by atomic layer deposition.

Further ALD layers that can be provided in microacoustic components include, for example, metallization layers having a small proportion of a dopant introduced as a very thin layer; hard dielectric layers on piezoelectric substrates like $LiNbO_3$ or $LiTaO_3$; layer systems that change in a gradated manner; seed layers for changing a texture of the surface or generally for a change of material properties, preferably in FBAR and GBAW components; extremely accurately and uniformly deposited tuning, trimming and passivation layers in FBAR components; and adhesion layers for UBM (under bump metallization). Moreover, specific layers which have a good thermal conductivity and are used for heat diffusion in order to avoid local overheating (heat spreader) can be embodied as ALD layers.

In an application of the atomic layer deposition method for a surface wave component, in particular a covering layer that partly or completely covers the surface of the component can be embodied as an ALD layer. In a surface wave component, a metallic strip structure composed of a metallic basis material is usually situated on a piezoelectric material. The basis material can be alloyed with at least one metallic element. The metallic strip structure can be amorphous, nanocrystalline and/or polycrystalline. It can also consist of a multilayer system. The metallic strip structure can be embodied as an ALD layer. Specifically, both the covering layer and the metallic strip structure can be embodied as ALD layers.

An ALD layer of a surface wave component can comprise an element of the first, fourth, fifth, sixth or eighth subgroup or of the third main group of the Periodic Table of the Elements. Instead of only one of the elements, a compound or alloy composed of at least two of the elements can be present in the ALD layer. The elements are, in particular, metals having a high electrical conductivity such as, for example, aluminum, copper, silver, gold, titanium, palladium, platinum, molybdenum or rubidium. The metals are suitable, in particular, for the electrodes of devices such as surface wave components. In preferred configurations, in particular, the ALD layer can contain one or a plurality of further elements in a proportion of 5 to 20 atomic percent.

Deposition of a mixture of elements or compounds like deposition of an alloy can be performed by alternating deposition of pure monolayers of the respective compounds maybe in a desired relation. Further, it is possible to perform a ALD deposition using a mixture of different precursors provided for deposition of different elements or compounds.

A dielectric ALD layer of a surface wave component can be, in particular, an oxide, nitride or carbide of an element of the third, fourth, fifth, sixth or eighth subgroup or of the second, third or fourth main group of the Periodic Table of the Elements. In particular, aluminum oxide, titanium oxide, rubidium oxide, magnesium oxide, tantalum oxide, silicon oxide, tantalum nitride, titanium nitride, titanium aluminum nitride and titanium carbide in different stoichiometric compounds are appropriate for this purpose. In addition, one or a plurality of further elements or compounds, in particular from the specified groups of elements, oxides, nitrides or carbides, preferably in a proportion of 5 to 50 atomic percent, can be present for stabilizing a specific crystallographic phase.

In the microacoustic component, dielectric or electrically insulating layers can be produced by sequential production by means of atomic layer deposition as a multilayer arrangement. The electrically insulating layers can be produced instead by simultaneous production of a plurality of components by means of atomic layer deposition as a doped layer or as a layer stack, wherein at least one layer of the layer stack can be doped. At least one layer of the layer stack can be doped, in particular, in a manner such that the dopant concentration has a gradient in the direction perpendicular to the layer plane.

A metallic basis material used as a metallic strip structure, for example, in a microacoustic component can contain at least one further element having a diffusion constant for its diffusion in the metallic basis material which is higher than the self-diffusion constant of the metallic basis material. The self-diffusion constant is the diffusion constant for the metallic basis material in itself. The metallic strip structure can contain the further element in dissolved form as an alloy or solid solution, as precipitation or as one or a plurality of multilayers in the basis material. A metallic or insulating basis material of an ALD layer can additionally contain at least one further element used to perform a targeted setting of the mismatch of the lattice constants between the layer applied by means of ALD and a respectively adjacent layer or the substrate.

The desired properties of the metallic or insulating ALD layer can be set and fixed by heat treatment and/or external driving forces in an atmosphere set in a targeted manner, preferably under a gas atmosphere and in the temperature range between room temperature and 300° C.

A metallic strip structure provided as electrodes, in particular, can consist, for example, of a copper, a silver or an aluminum basis alloy or of gold. The metallic strip structure can be formed from a material which can be enveloped by means of atomic layer deposition in such a way that selectively only the material is enveloped. For this purpose, the strip structure can contain an element which shows a reactivity (free bonds) with a precursor at an uncovered surface of the strip structure.

An ALD layer of the component can be amorphous, nanocrystalline, polycrystalline or monocrystalline. In the case of a nanocrystalline ALD layer, the grain sizes are preferably kept substantially in a range below 50 nm.

Figure 3:
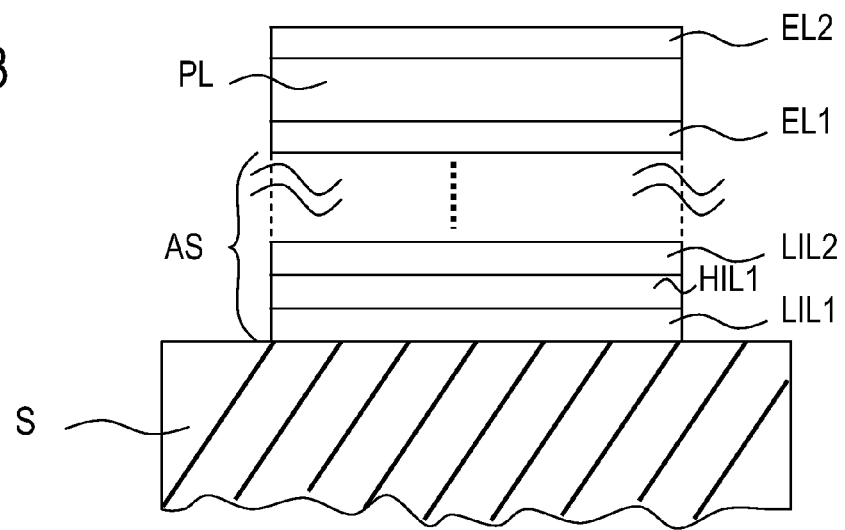
FIG. 3 shows a cross sectional view of a BAW resonator.

FIG. 3 shows a cross section of a BAW resonator built up on a substrate S and comprising a bottom electrode layer EL1, a piezoelectric layer PL and a top electrode layer EL2. The BAW resonator can be free standing or arranged above a recess in the substrate, arranged over a thinned section of the substrate or arranged over a membrane. In FIG. 3, an acoustic minor AS is arranged between substrate S and bottom electrode EL1 of the BAW resonator. The minor comprises alternating layers of high and low impedance. The minor comprises at least one pair of a high and a low impedance layer. FIG. 3 emphasizes that the stack can comprise more than one pair of those layers. Each layer can, but need not be, an ALD layer.

A second BAW resonator can be arranged above the first BAW resonator. The top electrode EL2 of the first BAW resonator can commonly be used by both resonator. A coupling layer that can be passed by acoustic waves at least partly can be arranged within the stack between both resonators. It is possible to acoustically isolate the upper resonator totally and to use stacking only for 3D integration. For a complex multilayer stack it is advantageous if at least one layer is an ALD layer.

Figure 4:
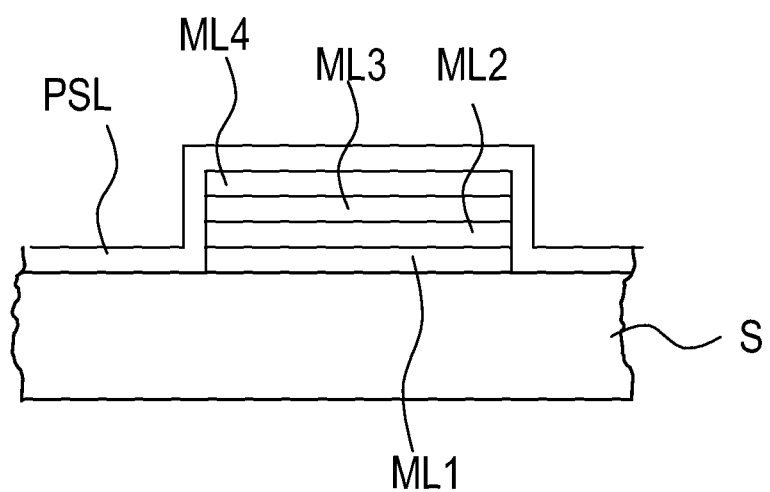
FIG. 4 shows a cross sectional view of a layer stack comprising a passivation layer.

FIG. 4 shows a structured layer stack deposited on a substrate S and comprising a first to a fourth layer ML1-ML4. The structured layers are, for example, different metal layers forming a multilayer electrode structure. The structured stack can be covered by a passivation layer PSL if one of the layers is sensitive to oxidation or corrosion. At least one or all layers of the stack and the passivation layer can be embodied as an ALD layer respectively.

FIG. 4 shows a perfect edge covering of the passivation layer that is embodied as an ALD layer thereby not comprising lunkers but showing uniform thickness even at the edges. This is very important and indispensable for the passivation effect of the passivation layer.

The use of the atomic layer deposition method for producing microacoustic components has the advantage that very precise control of the layer thickness is possible. Although a trimming process can be carried out, if appropriate, in order to compensate for frequency variations on account of other effects, it is no longer necessary in principle. Therefore, the entire production process is significantly simplified and therefore also significantly more economic.

On account of the good edge coverage achieved with the use of the atomic layer deposition method for producing microacoustic components, it is possible to produce a very good enveloping of a metallization. Primarily the case of metallizations composed of copper, this significantly reduces a diffusion process which substantially takes place at the surface of the metal. At the same time, a defined setting of the inherent stress state is achieved, such that the average inherent mechanical stress of the metallization under loading is minimized.

What is claimed is:

1. A method for producing a microacoustic component, the method comprising:
    directly depositing a layer over a partially formed microacoustic component, the layer being deposited using an atomic layer deposition method as a series of self-passivating monolayers of uniform thickness, a number of self-passivating monolayers being chosen to obtain a thickness of the deposited layer that is chosen to effect a desired frequency accuracy of the microacoustic component, wherein at least one of the self-passivating monolayers comprises a piezoelectric material; and
    completing the microacoustic component;
    wherein the directly depositing the layer achieves the desired frequency accuracy such that producing the microacoustic component includes no trimming steps.

2. The method according to claim 1, wherein at least another one of the self-passivating monolayers comprises a dielectric material.

3. The method according to claim 1, wherein using the atomic layer deposition method comprises forming a covering layer comprising a dielectric material.

4. The method according to claim 1, wherein the microacoustic component comprises a surface acoustic wave component, a guided bulk acoustic wave component or an FBAR component.

5. The method according to claim 1, further comprising determining the number of self-passivating monolayers based upon the desired frequency accuracy of the microacoustic component.

6. A method of forming a micro-acoustic component, the method comprising:
    directly forming a bottom electrode over a substrate using a first atomic layer deposition (ALD) process; and
    directly depositing a piezoelectric layer of a thin-film bulk acoustic resonator over the substrate using a second ALD process,
    wherein the first and the second ALD processes control a thickness and uniformity of the bottom electrode and the piezoelectric layer so as to achieve a selected frequency and a desired frequency accuracy such that the method of forming the micro-acoustic component includes no trimming steps, and
    wherein the bottom electrode and the piezoelectric layer comprise two different frequency determining layers of the micro-acoustic component.

7. The method according to claim 6, wherein the first ALD process forms an ALD layer comprising a metal of the first, fourth, fifth, sixth or eighth subgroup or of the third main group of the Periodic Table of the Elements or an electrically insulating oxide, nitride or carbide of an element of the third, fourth, fifth, sixth or eighth subgroup or of the second, third or fourth main group of the Periodic Table of the Elements.

8. The method according to claim 6, wherein the first ALD process comprises an ALD method that deposits a metal and 5 to 20 atomic percent of a further element.

9. The method according to claim 6, wherein the first ALD process comprises an ALD method that deposits an oxide, nitride or carbide and 5 to 50 atomic percent of a further element, oxide, nitride or carbide.

10. A method of forming a micro-acoustic component, the method comprising:
    directly forming a metallic electrode over a substrate using a first atomic layer deposition (ALD) process; and
    directly depositing a second layer over the substrate using a second ALD process,
    wherein the second layer comprises a dielectric covering layer of SiO2 of a guided bulk acoustic wave or surface acoustic wave device,
    wherein the first and the second ALD processes control a thickness and uniformity of the metallic electrode and the dielectric covering layer so as to achieve a selected frequency,
    wherein the metallic electrode and the dielectric covering layer comprise two different frequency determining layers of the micro-acoustic component;
    wherein the directly forming the metallic electrode and the directly depositing the second layer achieves a desired frequency accuracy such that the method of forming the micro-acoustic component includes no trimming steps.

11. The method according to claim 10, wherein the metallic comprises gold or a copper, silver or aluminum alloy.

12. The method according to claim 10, wherein the first ALD process forms an ALD layer comprising a metal of the first, fourth, fifth, sixth or eighth subgroup or of the third main group of the Periodic Table of the Elements.

13. The method according to claim 10, wherein the first ALD process comprises an ALD method that deposits a metal and 5 to 20 atomic percent of a further element.

14. The method according to claim 10, wherein the first ALD process comprises an ALD method that deposits an oxide, nitride or carbide and 5 to 50 atomic percent of a further element, oxide, nitride or carbide.

15. A method of forming a micro-acoustic component, the method comprising:
    directly forming a piezoelectric layer over a substrate using a first atomic layer deposition (ALD) process; and directly depositing a top electrode of a thin-film bulk acoustic resonator over the substrate using a second ALD process, wherein the first and the second ALD processes control a thickness and uniformity of the piezoelectric layer and the top electrode so as to achieve a selected frequency and a desired frequency accuracy such that the method of forming the micro-acoustic component includes no trimming steps, and wherein the piezoelectric layer and the top electrode comprise two different frequency determining layers of the micro-acoustic component.

16. The method according to claim 15, wherein the second ALD process forms an ALD layer comprising a metal of the first, fourth, fifth, sixth or eighth subgroup or of the third main group of the Periodic Table of the Elements or an electrically insulating oxide, nitride or carbide of an element of the third, fourth, fifth, sixth or eighth subgroup or of the second, third or fourth main group of the Periodic Table of the Elements.

17. The method according to claim 15, wherein the second ALD process comprises an ALD method that deposits a metal and 5 to 20 atomic percent of a further element.

18. The method according to claim 15, wherein the second ALD process comprises an ALD method that deposits an oxide, nitride or carbide and 5 to 50 atomic percent of a further element, oxide, nitride or carbide.

* * * * *